(12) United States Patent
Lee et al.

(10) Patent No.: US 6,864,124 B2
(45) Date of Patent: Mar. 8, 2005

(54) METHOD OF FORMING A FUSE

(75) Inventors: Chiu-Te Lee, Hsin-Chu (TW); Te-Yuan Wu, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 205 days.

(21) Appl. No.: 10/064,052

(22) Filed: Jun. 5, 2002

(65) Prior Publication Data

US 2003/0228756 A1 Dec. 11, 2003

(51) Int. Cl.[7] ............................................. H01L 21/82
(52) U.S. Cl. ........................ 438/132; 438/601; 257/529
(58) Field of Search ................................. 438/132, 601, 438/622, 634, 636, 637; 257/209, 296, 529

(56) References Cited

U.S. PATENT DOCUMENTS 5,844,295 A * 12/1998 Tsukude et al. ............ 257/529
6,433,438 B2 * 8/2002 Koubuchi et al. .......... 257/776
6,677,226 B1 * 1/2004 Bowen et al. .............. 438/601
6,707,129 B2 * 3/2004 Wang ......................... 257/529

* cited by examiner

*Primary Examiner*—Duy-Vu N. Deo
(74) *Attorney, Agent, or Firm*—Winston Hsu (57) ABSTRACT

A surface of a semiconductor substrate defined with at least one fuse area and at least one bonding pad area. A conductive layer with a thickness of 12 kÅ and a protective layer are sequentially formed on the surface of the semiconductor substrate. Then portions of the protective layer and portions of the conductive layer in the fuse area are etched to make the thickness for the remaining conductive layer in the fuse area be approximately 5 kÅ. Finally a dielectric layer is formed on the surface of the semiconductor substrate, and portions of the first dielectric layer and portions of the protective layer in the bonding pad area are etched until reaching the top surface of the conductive layer.

19 Claims, 9 Drawing Sheets

METHOD OF FORMING A FUSE

BACKGROUND OF INVENTION

1. Field of the Invention

The present invention relates to a method of forming a fuse, and more particularly, to a method of forming fuse and bonding pad with a single-layered aluminum metal and two photo-etching-processes (PEP).

2. Description of the Prior Art

Aluminum alloys with silicon dioxide ($SiO_2$) dielectrics have been the materials of choice for interconnect systems since the dawn of the integrated circuit (IC) era. These materials were convenient to process using mature subtractive etch processes for metal line patterning. However, as ICs have relentlessly marched down the path towards smaller geometry and to a deep sub-micron generation in the pursuit of increased speed, the traditional $Al/SiO_2$ interconnect system has shown itself to be a limiting factor. Cu-dual damascene architectures with low-k dielectrics are thus developing and becoming the norm now in forming interconnects. Overall, RC delays occurring during signal transmission are reduced and operating performance is improved because Cu has a 40% less resistivity compared with aluminum, and low-k materials reduce the capacitance between interconnections.

In an integrated circuit, each transistor or cell needs to be electrically connected to corresponding metal lines within different metal layers after being formed. Then the transistors are electrically connected to bonding pads through each metal line. After being packaged, the integrated circuit is electrically connected to an external circuit through terminals, which are electrically connected to bonding pads. In a memory device, structures known as fuses are usually formed within the top metal layer. If there are portions of malfunctioning memory cells, word lines, or metal lines in a completed memory device, some redundant cells, redundant word lines, or redundant metal lines are utilized to replace them. The method is to use a laser zip step to sever fuses. Then a laser repair step including laser cutting, laser linking, etc., is used to sever the original electrical connection to the malfunctioning memory cells, word lines, or metal lines, or to form some new electrical connection to compensate the useless memory cells, word lines, or metal lines.

Figure 1:
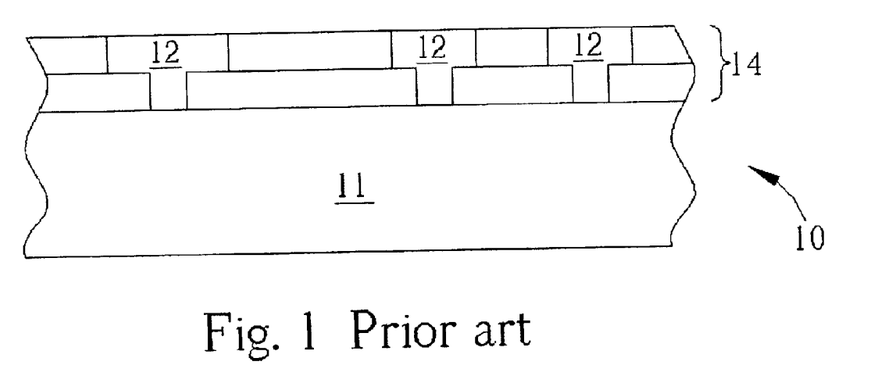
FIG. 1 through FIG. 4 are schematic diagrams of the formation of a fuse on a semiconductor wafer according to the prior art method.

Please refer to FIG. 1 through FIG. 4. FIG. 1 through FIG. 4 are schematic diagrams showing the formation of a fuse 26 on a semiconductor wafer according to the prior art method. As shown in FIG. 1, at least one memory cell (not shown) or at least one transistor (not shown) is formed on a silicon substrate 11 on a semiconductor wafer 10 followed by the formation of individual metal lines 12. Different metal lines 12 are isolated by a first dielectric layer 14.

The metal lines 12 are composed of aluminum or copper. In the case where aluminum is used, a continuous process including deposition, photolithography, and etching is utilized. In the case where copper is used, a dual damascence process is usually utilized. The reason is that aluminum is usually formed by a DC magnetron sputtering process, which is characterized by its poor step coverage ability. In the process generation beyond 0.13 $\mu$m, line width is smaller, aspect ratio is relatively increased, and the poor step coverage ability causes a severe problem. Although a high temperature (>400° C.) aluminum process with an improved step coverage ability due to a high surface migration rate at high temperature has been developed, it is not satisfactory.

However, aluminum is easily deposited and etched, and is very cheap as well. Thus, aluminum is widely utilized in semiconductor factories. Although the metal lines composed of copper are superior to the metals composed of aluminum in terms of electrical performance, the etching process for copper cannot be done in a chemical way because of the poor volatile ability of copper-chloride-alloy, which is a drawback of copper metal lines. The copper is etched by physical momentum produced by the bombardment of ions in plasma on the copper, hence the copper metal line is formed by the dual damascence process to skip the etching process for copper.

Figure 2:
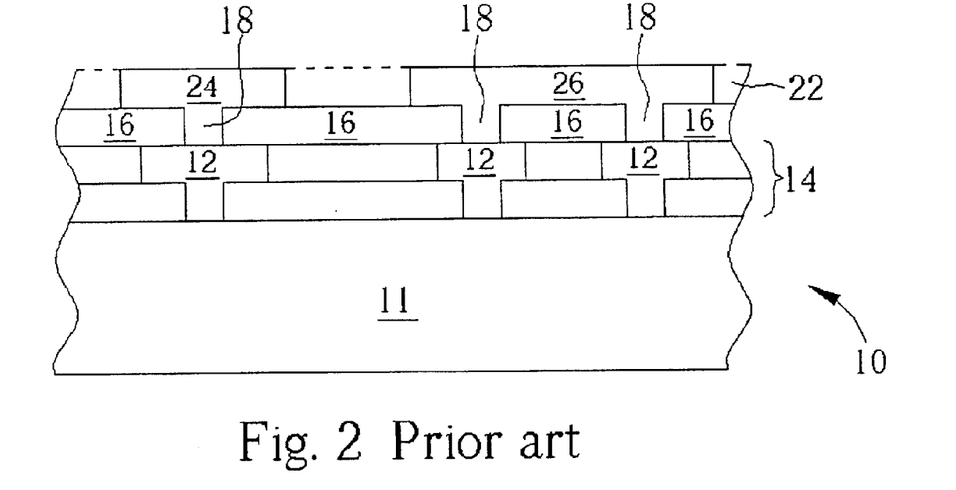

As shown in FIG. 2, a second dielectric layer 16 is formed on the first dielectric layer 14 and the metal lines 12. Then at least one via hole 18 is formed in the second dielectric layer 16. The via hole 18 extends from the top surface of the metal lines 12 up to the top surface of the second dielectric layer 16. After that, a metal layer 22 is formed on the entire surface of the semiconductor wafer 10, and the metal layer 22 fills the via hole 18. It is worth noting that a conductive plug may be formed by a deposition and an etching process followed by the formation of a metal layer. Thereafter a photolithography process is performed by utilizing a photoresist layer (not shown) to define the sites of pads 24 and fuses 26 in the metal layer 22. Finally an anisotropic dry etching process is performed to form a pad 24 and fuse 26 in the metal layer 22.

Figure 3:
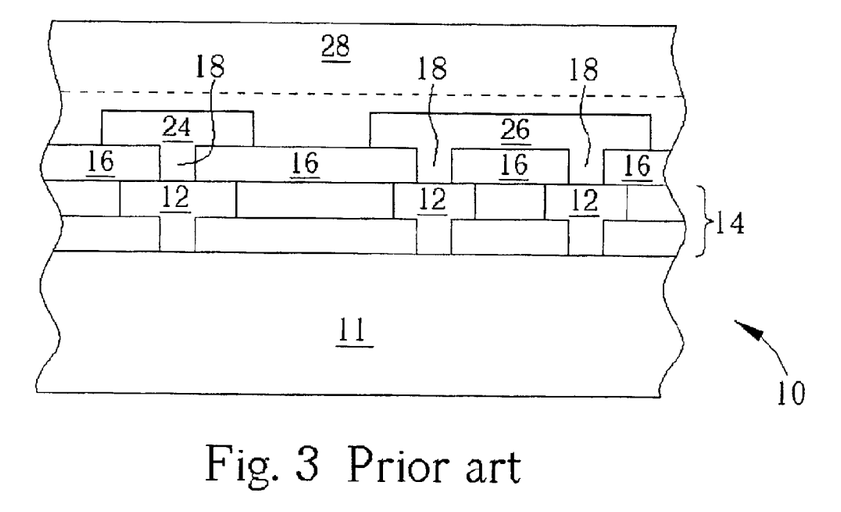

As shown in FIG. 3, a third dielectric layer 28 is formed on the second dielectric layer 16, the pad 24 and the fuse 26. The third dielectric layer 28, also called as a passivation layer, covers the second dielectric layer 16, the pad 24 and the fuse 26 completely. Then an etching back process is performed from the top surface of the third dielectric layer 28 downwards. It is worth noting that the third dielectric layer 28 is composed of transparent material so the laser beam is able to transmit and sever the fuse 26 in the subsequent laser zip process.

Figure 4:
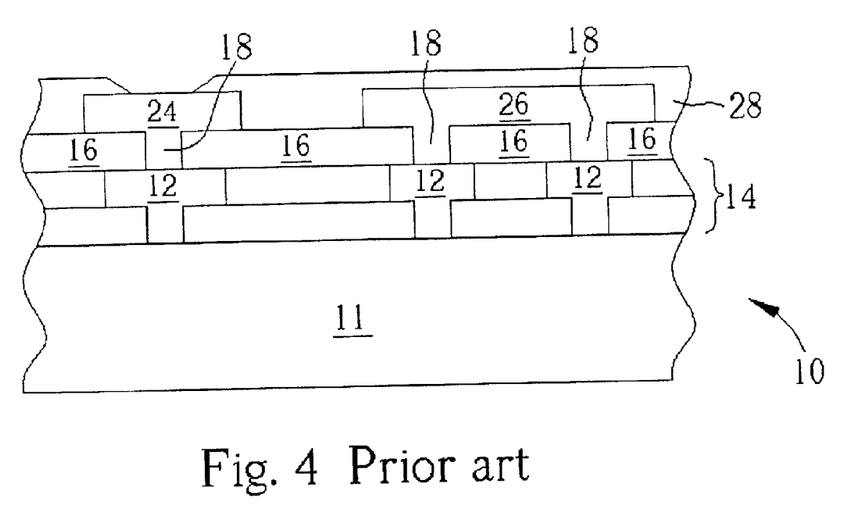

As shown in FIG. 4, a photo-etching-process (PEP) is performed to remove the third dielectric layer 28 on top of the bonding pads 24. The metal material is therefore exposed so the testing and packaging processes can be performed.

Similar to metal lines, the composition material for metal layers is aluminum or copper. That means the fuse 26 is composed of aluminum or copper. If the fuse is composed of copper, an electroplating process is usually used. However, copper is difficult to evaporate during the laser zip process because of its high melting point. A splash phenomenon results and causes difficulty in assuring high reliability. If the fuse is composed of aluminum, its thickness is increased in the process generation beyond 0.13 $\mu$m to prevent the occurrence of an open circuit due to the electromigration tendency of aluminum. To increase the thickness of aluminum brings difficulty to the process, and it is difficult to sever the fuse. In the prior art, the energy of laser beam can be adjusted by adjusting the laser spot size. However, the higher the energy of laser beam, the higher probability of damaging the structure underneath. If the composition material in the via hole is aluminum, its poor step coverage ability easily induces problems. It is therefore very important to develop a method of forming a fuse composed of aluminum and to not bring difficulty to the subsequent laser zip process.

SUMMARY OF INVENTION

It is therefore a primary objective of the claimed invention to provide a method of forming a fuse, especially a method by utilizing a single-layered aluminum and two photoetching-processes to form fuses and bonding pads to resolve the above-mentioned problem.

According to the claimed invention, a surface of a semiconductor substrate, defined with at least one fuse area and at least one bonding pad area, is provided. Then a conductive layer with a thickness of 12 kÅ and a protective layer are sequentially formed on the surface of the semiconductor substrate. Thereafter portions of the protective layer and portions of the conductive layer in the fuse area are etched. After being processed, the remaining thickness of the conductive layer in the fuse area is approximately 5 kÅ, and is utilized as a fuse for circuits on the semiconductor substrate. Finally a dielectric layer is formed on the surface of the semiconductor followed by etching portions of the dielectric layer and the protective layer on top of the bonding pad area until reaching the top surface of the conductive layer.

It is an advantage of the claimed invention that the method of forming the fuse is to form a fuse opening by removing the third dielectric layer on top of the fuse with a fuse mask and an additional photo-etching-process. Then an anisotropic dry etching process is performed to remove a predetermined thickness of the metal layer underneath the fuse opening. After that an oxide layer is formed on the surface of the semiconductor substrate. Finally a passivation opening is formed by utilizing a pad mask and another photo-etching-process. As a result, the thickness for the fuse is reduced, due to the additional photo-etching-process and the subsequent anisotropic dry etching process, without adding any metal deposition process. Hence the aluminum layer will not be too thick to sever. In addition, the oxide layer on top of the fuse is formed by a deposition process, and its thickness uniformity is better than the oxide layer formed by the traditional etching back process. Moreover, the bondability of the bonding pad during packaging process is maintained because the thickness for the aluminum bonding pad remains at the thickness for the original metal layer. These and other objectives of the present invention will no doubt become obvious to those of ordinary skill in the art after reading the following detailed description of the preferred embodiment, which is illustrated in the various figures and drawings.

DETAILED DESCRIPTION

Figure 5:
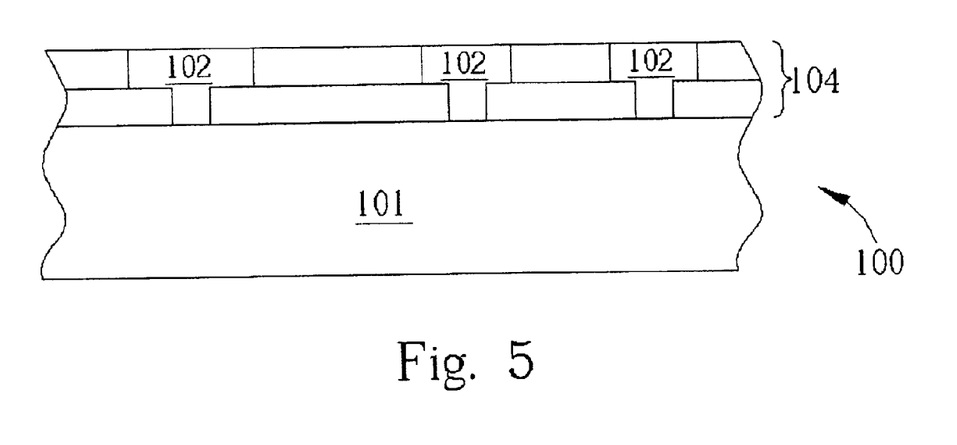
FIG. 5 to FIG. 9 are schematic diagrams of forming a fuse on a semiconductor wafer according to the present invention.

Please refer to FIG. 5 through FIG. 9. FIG. 5 through FIG. 9 are schematic diagrams showing the formation of a fuse 116 on a semiconductor wafer 100 according to the present invention method. As shown in FIG. 5, the semiconductor wafer 100 comprises a silicon substrate 101. At least one memory cell (not shown) or at least one transistor (not shown) is formed on the silicon substrate 101. The present invention method is to form individual metal lines 102 on the silicon substrate 101 first. Different metal lines 102 are isolated by a first dielectric layer 104. The metal line 102 comprises a metal interconnection electrically connected to a conductive plug or a dual damascence structure conductor. The metal lines 102 are composed of aluminum or copper. In the case where aluminum is used, a continuous process including deposition, photolithography, and etching is utilized. In the case where copper is used, a dual damascence process is usually used.

As mentioned previously, aluminum is usually formed by a DC magnetron sputtering process, which is characterized by its poor step coverage ability. In the process generation beyond 0.13 $\mu$m, line width is smaller, aspect ratio is relatively increased, and the poor step coverage ability causes a severe problem. Although a high temperature (>400° C.) aluminum process having an improved step coverage ability due to a high surface migration rate at high temperature has been developed, it is not satisfactory. However, aluminum is easily deposited and etched, and is very cheap as well, it is widely utilized in semiconductor factories. Although the metal lines composed of copper are superior to the metal lines composed of aluminum in terms of electrical performance, the etching process for copper cannot be done in a chemical way because of the poor volatile ability of copper-chloride-alloys, which is a drawback of copper metal lines. The copper is etched by physical momentum produced by the bombardment of ions in plasma on the copper. Hence, the copper metal line is formed by the dual damascence process to skip the etching process for copper.

Figure 6:
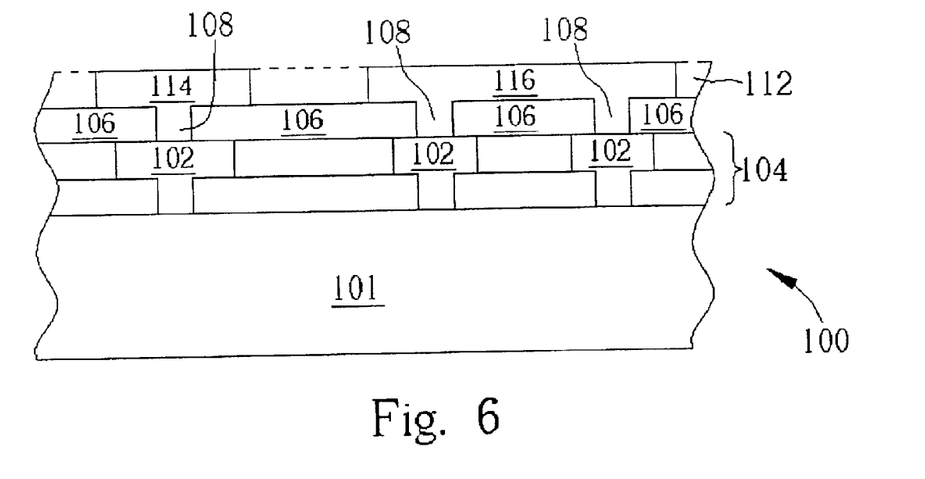

As shown in FIG. 6, a second dielectric layer 106 is formed on the first dielectric layer 104 and the metal lines 102. Then at least one via hole 108 is formed in the second dielectric layer 106. The via hole 108 extends from the top surface of the metal lines 102 up to the top surface of the second dielectric layer 106. Thereafter a metal layer 112 with a thickness of 12 kÅ and composed of aluminum is formed on the entire surface of the semiconductor wafer 100. The metal layer 112 fills the via hole 108. After that, a photolithography process is performed by utilizing a photoresist layer (not shown) to define the sites of pads 114 and fuses 116 in the metal layer 112, respectively. It is worth noting that a conductive plug may be formed by a deposition and an etching process after the formation of the via holes 108 followed by the formation of a metal layer 112.

Figure 7:
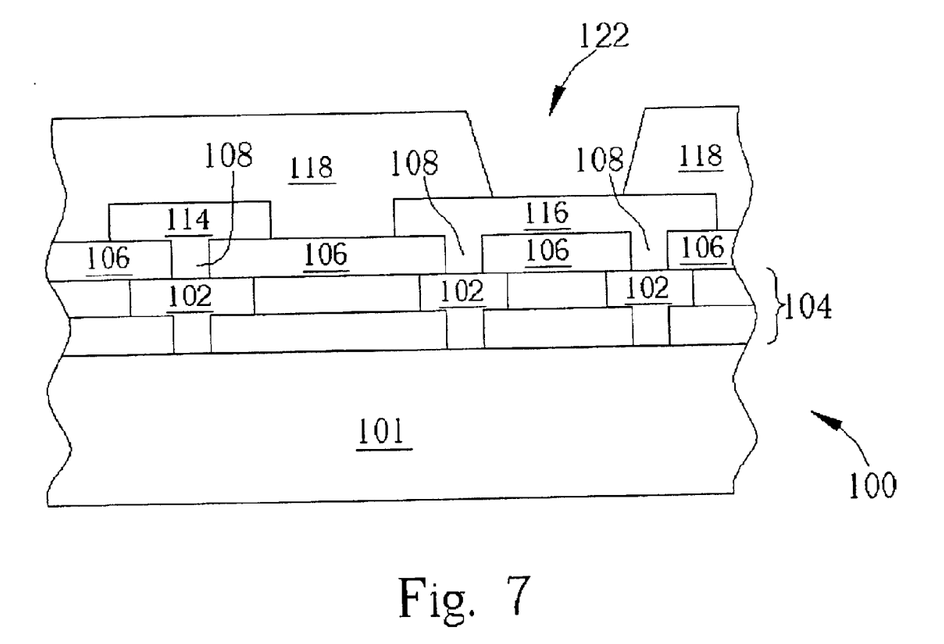
Figure 8:
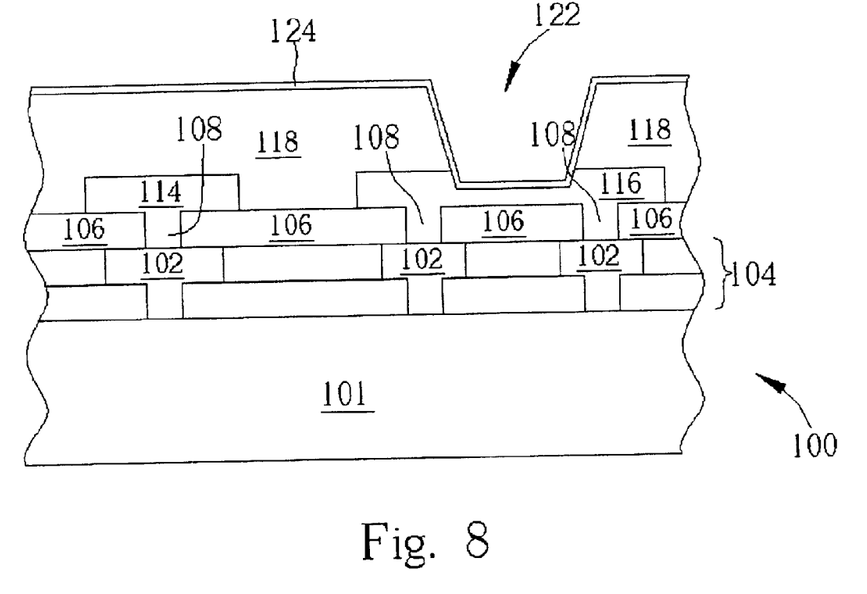

As shown in FIG. 7, a third dielectric layer 118, utilized as a passivation layer, is formed on the second dielectric layer 106, the pad 114, and the fuse 116. The third dielectric layer 118 covers the second dielectric layer 106, the pad 114, and the fuse 116 completely. Then a first photo-etching-process is performed to form a fuse opening 122 by removing the third dielectric layer 118 on top of the fuse 116 with a fuse mask (not shown). As shown in FIG. 8, thereafter a second anisotropic dry etching process is performed to remove a predetermined thickness of the metal layer 112 underneath the fuse opening 122 until the thickness for the remaining fuse 116 is 5 kÅ. After that, an oxide layer 124 with a thickness of 1 kÅ is formed on the entire surface of the semiconductor wafer 100. The oxide layer 124 is composed of transparent material so the laser beam is able to transmit and sever the fuse 116 in the subsequent laser zip process.

Figure 9:
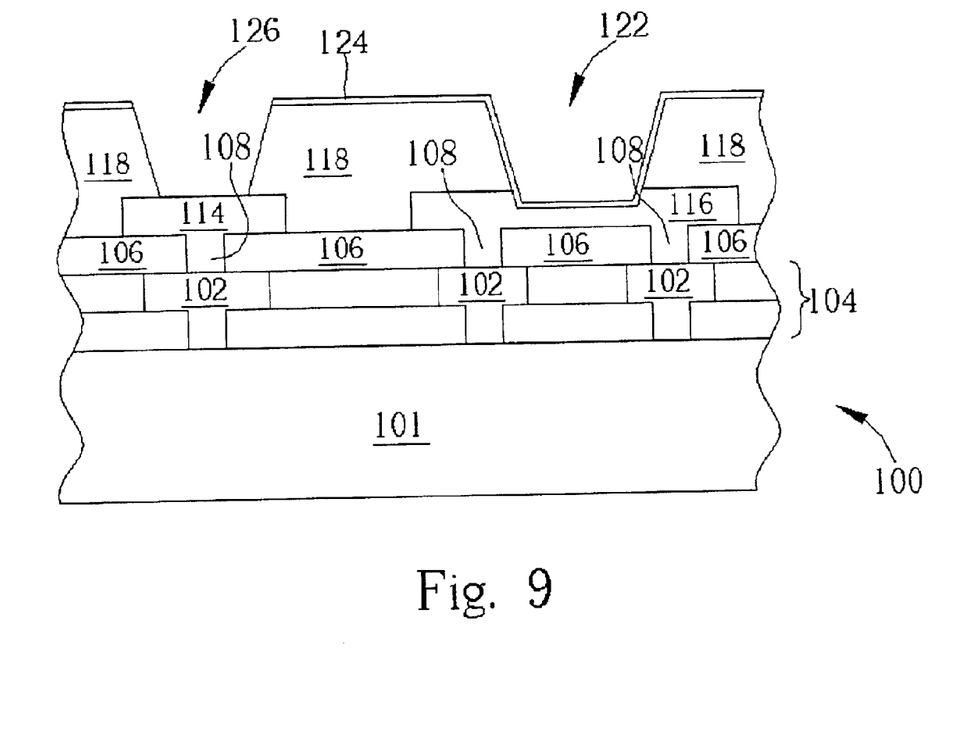

As shown in FIG. 9, a second photo-etching-process is performed to form a passivation opening 126 by removing the oxide layer 124 and the third dielectric layer 118 with a pad mask (not shown). The metal material composed the bonding pad 114 is therefore exposed for use as the bonding pad opening so the testing and packaging process are able to be performed.

The method of forming the fuse according to the present invention is to form a fuse opening by removing the third dielectric layer on top of the fuse with a fuse mask and a photo-etching-process. Then an anisotropic dry etching process is performed to remove a predetermined thickness of the metal layer underneath the fuse opening. After that an oxide layer is formed on the surface of the semiconductor substrate. Finally a bonding pad opening is formed in the passivation layer by utilizing a bonding pad mask and another photo-etching-process. Therefore the thickness for the fuse is reduced greatly without adding any metal deposition process. Hence the aluminum layer will not be too thick to sever during the subsequent laser zip process. The oxide layer on top of the fuse is formed by a deposition process. As a result, the thickness uniformity of the oxide layer covering the surface of the fuse is better than the oxide layer formed by the traditional etching back process. Moreover, the bondability of the bonding pad during the packaging process is maintained since the thickness for the aluminum bonding pad remains at the thickness for the original metal layer.

In contrast to the prior art method of forming the fuse, the present invention forms a fuse opening by using a fuse mask and a photo-etching-process. A predetermined thickness of the metal layer is thereafter removed to form the fuse structure. Thus, a thick aluminum bonding pad and a thin fuse can be simultaneously formed on the semiconductor wafer without any extra metal deposition process. Therefore, the situation of not being able to sever the thick aluminum layer during laser zip process will not occur. The bondability during the packaging process is improved due to the thickness for the aluminum bonding pad remaining at the original thickness for the metal layer.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of making a conductive layer on a substrate, a surface of the substrate comprising a first area and a second area, the method comprising:
    forming at least one conductive layer on the first area and on the second area, respectively;
    forming a first dielectric layer on the surface of the substrate that covers each conductive layer;
    removing portions of the first dielectric layer to define at least one first opening in the first dielectric layer, and using the first dielectric layer as a mask to remove portions of the conductive layer underneath the first opening until the remaining conductive layer in the first area is of a predetermined thickness; and
    removing portions of the first dielectric layer in the second area until reaching the top surface of the conductive layer.

2. The method of claim 1 wherein the substrate is a silicon substrate.

3. The method of claim 1 wherein the surface of the substrate further comprises at least one second dielectric layer and at least one conductor disposed in the second dielectric layer.

4. The method of claim 3 wherein the conductor comprises a conductive plug, a metal line, a metal interconnection or a dual damascence structure conductor.

5. The method of claim 3 wherein the material composition of the conductor comprises tungsten (W), copper (Cu), aluminum (Al), aluminum-copper-alloy or other conductive material.

6. The method of claim 1 wherein a deposition process is executed to form a third dielectric layer on the surface of the substrate so as to cover the first dielectric layer and the conductive layer in the first area before removing portions of the first dielectric layer in the second area.

7. The method of claim 6 wherein the method for removing portions of the first dielectric layer in the second area comprises:
    performing a second photo-etching-process to form at least one second opening down to the top surface of the conductive layer in the third dielectric layer and the first dielectric layer in the second area.

8. The method of claim 6 wherein the third dielectric layer is a transparent layer.

9. The method of claim 1 wherein the thickness of the conductive layer is approximately 12 kÅ, and the predetermined thickness is approximately 5 kÅ.

10. The method of claim 1 wherein the material composition of the conductive layer comprises tungsten (w), copper (Cu), aluminum (Al), aluminum-cooper-alloy or other conductive material.

11. The method of claim 1 wherein the first area is a fuse area and the conductive layer in the first area is utilized as a fuse, the second area is a bonding pad area and the conductive layer in the second area is utilized as a bonding pad.

12. The method of claim 1 wherein the first area is a core circuit area and the second area is a periphery circuit area, the conductive layers in the first area and the second area are utilized as metal lines.

13. The method of making a fuse, the method comprising:
    providing a semiconductor substrate, a surface of the semiconductor substrate defined with a first area and a second area;
    forming a first dielectric layer on the surface of the semiconductor substrate;
    forming at least one first conductive layer and at least one second conductive layer on the first dielectric layer in the first area and in the second area, respectively;
    forming a second dielectric layer on the surface of the first dielectric layer to cover each conductive layer;
    performing a first photo-etching-process to form at least one first opening down to the top surface of the first conductive layer in the second dielectric layer in the first area;
    removing portions of the first conductive layer underneath the first opening so the remaining first conductive layer is of a predetermined thickness and is utilized as the fuse;
    forming a third dielectric layer on the surface of the semiconductor substrate; and
    performing a second photo-etching-process to form at least one second opening down to the top surface of the second metal layer in the second dielectric layer in the second area.

14. The method of claim 13 wherein the semiconductor substrate is a silicon substrate.

15. The method of claim 13 wherein the surface of the semiconductor substrate further comprises at least one fourth dielectric layer and at least one conductor disposed in the fourth dielectric layer.

16. The method of claim 15 wherein the conductor comprises a conductive plug, a metalline, a metal interconnection or a dual damascence structure conductor.

17. The method of claim 13 wherein the first dielectric layer further comprises a plurality of conductive plugs.

18. The method of claim 17 wherein the method for forming each conductive plug further comprises the following steps:

performing a first etching process to form a plurality of via holes in the first dielectric layer; and forming a metal layer in the via holes, the metal layer filling the via holes.

19. The method of claim 13 wherein each conductive layer is an aluminum layer formed by a DC magnetron sputtering process and an etching process, and the third dielectric layer is a silicon oxide layer with a thickness of approximately 1 kÅ.

* * * * *